United States Patent
Okayama

(10) Patent No.: US 11,248,310 B2
(45) Date of Patent: Feb. 15, 2022

(54) GROUP III NITRIDE SUBSTRATE AND METHOD FOR PRODUCING GROUP III NITRIDE CRYSTAL

(71) Applicant: Panasonic Intellectual Property Management Co., Ltd., Osaka (JP)

(72) Inventor: Yoshio Okayama, Osaka (JP)

(73) Assignee: PANASONIC INTELLECTUAL PROPERTY MANAGEMENT CO., LTD., Osaka (JP)

( * ) Notice: Subject to any disclaimer, the term of this patent is extended or adjusted under 35 U.S.C. 154(b) by 817 days.

(21) Appl. No.: 15/429,167

(22) Filed: Feb. 10, 2017

(65) Prior Publication Data

US 2017/0275780 A1    Sep. 28, 2017

(30) Foreign Application Priority Data

Mar. 25, 2016 (JP) .............................. JP2016-061042
Oct. 27, 2016 (JP) .............................. JP2016-210870

(51) Int. Cl.
| | | |
|---|---|---|
| *C30B 29/40* | (2006.01) | |
| *C30B 19/02* | (2006.01) | |
| *C30B 19/12* | (2006.01) | |
| *C30B 23/02* | (2006.01) | |
| *C30B 25/18* | (2006.01) | |
| *C30B 29/22* | (2006.01) | |

(52) U.S. Cl.
CPC ............ *C30B 29/406* (2013.01); *C30B 19/02* (2013.01); *C30B 19/12* (2013.01); *C30B 23/025* (2013.01); *C30B 25/183* (2013.01); *C30B 29/22* (2013.01)

(58) Field of Classification Search
CPC ....... C30B 29/406; C30B 19/02; C30B 19/12; C30B 23/025; C30B 25/183; C30B 29/22; H01L 33/0075; H01L 33/025
See application file for complete search history.

(56) References Cited

U.S. PATENT DOCUMENTS

| 2011/0018003 | A1 | 1/2011 | Okahisa et al. |
|---|---|---|---|
| 2014/0110758 | A1* | 4/2014 | Saitoh ............... H01L 29/42364 257/194 |
| 2015/0115299 | A1* | 4/2015 | Grundmann ........ H01L 33/0093 257/96 |
| 2015/0179780 | A1* | 6/2015 | Terano .............. H01L 29/66318 257/76 |
| 2017/0260648 | A1* | 9/2017 | Okayama ................ C30B 19/12 |

FOREIGN PATENT DOCUMENTS

| CN | 101070472 A | 11/2007 |
|---|---|---|
| JP | 2010-235318 A | 10/2010 |
| JP | 2015-178448 | 10/2015 |

OTHER PUBLICATIONS

English Translation of Chinese Search Report dated Aug. 28, 2018 for the related Chinese Patent Application No. 201710056925.1.

* cited by examiner

*Primary Examiner* — Jonathan C Langman
(74) *Attorney, Agent, or Firm* — McDermott Will & Emery LLP

(57) ABSTRACT

A Group III nitride substrate contains a base material part of a Group III nitride having a front surface and a back surface, the front surface of the base material part and the back surface of the base material part having different Mg concentrations from each other.

10 Claims, 3 Drawing Sheets

GROUP III NITRIDE SUBSTRATE AND METHOD FOR PRODUCING GROUP III NITRIDE CRYSTAL

TECHNICAL FIELD

The technical field relates to a Group III nitride substrate and a method for producing a Group III nitride crystal.

BACKGROUND

In recent years, a crystal of a Group III nitride, such as GaN, is receiving attention as a material of a light emitting diode and the like. As one of the production methods of the crystal of a Group III nitride, a flux method has been known, in which a Group III element and nitrogen are reacted in a flux of Na or the like, and a crystal is grown on a substrate. The substrate used herein is generally a sapphire substrate or the like. As another production method, a vapor phase epitaxial method has been known, such as an HVPE method (hydride vapor phase epitaxial method), in which a halide gas of a Group III element and ammonia are reacted, and a crystal is grown on a substrate, and an OVPE method (oxide vapor phase epitaxial method), in which an oxide gas of a Group III element and ammonia are reacted. In the HVPE method and the OVPE method, the substrate used is also generally a sapphire substrate or the like. However, a sapphire substrate has a lattice mismatch ratio of 13.8% to GaN, and when a Group III nitride crystal is grown on a sapphire substrate, there is a problem that crystal defects are liable to occur.

As a substrate for producing a Group III nitride, an $ScAlMgO_4$ substrate has been proposed (see, for example, Patent Literature 1). Patent Literature 1: JP-A-2015-178448

The lattice constant of the $ScAlMgO_4$ substrate has a smaller mismatch ratio than sapphire, but does not completely agree with the lattice constant of a Group III nitride. Accordingly, there is a problem that a Group III nitride crystal undergoes warpage, cracks, and crystal defects when the crystal is grown on a substrate formed of a single crystal represented by the general formula $RAMgO_4$ (wherein R represents one or a plurality of trivalent elements selected from the group consisting of Sc, In, Y, and a lanthanoid element, and A represents one or a plurality of trivalent elements selected from the group consisting of Fe (III), Ga, and Al), examples of which include an $ScAlMgO_4$ substrate.

SUMMARY

An object herein is to provide a Group III nitride crystal with high quality.

For achieving the aforementioned and other objects, there is provided, as one aspect, a Group III nitride substrate containing a base material part of a Group III nitride having a front surface and a back surface, the front surface of the base material part and the back surface of the base material part having different Mg concentrations from each other.

According to the aforementioned and other aspects, a Group III nitride substrate with high quality can be produced.

DESCRIPTION OF EMBODIMENTS

Figure 1:
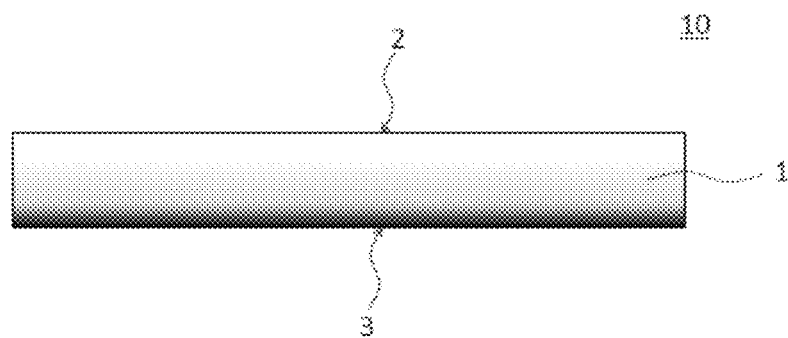
FIG. 1 is a schematic cross sectional view showing an example of a Group III nitride substrate according to one embodiment.

FIG. 1 is a schematic cross sectional view showing an example of a Group III nitride substrate 10 according to one embodiment. As shown in FIG. 1, the Group III nitride substrate 10 has a base material part 1 formed from a Group III nitride having a front surface 2 and a back surface 3. The front surface 2 and the back surface 3 of the base material part 1 have different Mg concentrations. Due to the difference in Mg concentration between the front surface 2 and the back surface 3, the lattice constants in the vicinity of the front surface 2 and in the vicinity of the back surface 3 are different from each other. Accordingly, the mismatch in lattice constant between the Group III nitride substrate 10 and a substrate or a crystal layer provided on the side of the front surface 2 or the side of the back surface 3 of the Group III nitride substrate 10 can be controlled to be small.

As for the lattice constant of a Group III nitride, it has been reported that the addition of an impurity changes the lattice constant depending on the concentration of the impurity. Specifically, the addition of Si or Be to GaN decreases the lattice constant, and the addition of Mg or O thereto increases the lattice constant. However, in the production of a device, such as a light emitting diode, on a Group III nitride substrate, it is necessary to form a light emitting layer or the like formed from a Group III nitride on a Group III nitride crystal. Therefore, a large change in lattice constant of the Group III nitride crystal provides a problem of deterioration of the crystal quality of the light emitting layer or the like. In this embodiment, accordingly, Mg is added to the base material part 1 (Group III nitride crystal), and thereby the mismatch in lattice constant therebetween can be appropriately relieved, achieving the formation of a Group III nitride crystal, such as GaN, with high quality.

The front surface 2 of the base material part 1 is a surface, on which a Group III nitrate crystal (for example, a light emitting layer, such as a light emitting diode) is to be grown, and the Mg concentration of the front surface 2 may be lower than the Mg concentration of the back surface 3. The lower Mg concentration of the front surface 2 makes the lattice constant of the front surface 2 of the base material part 1 and the lattice constant of the Group III nitrate crystal grown on the front surface 2 closer to each other, and thereby the Group III nitrate crystal obtained can have high quality. Furthermore, the base material part 1 of the embodiment may have the front surface 2 that is a +C plane (for example, the front surface 2 may be a Ga polar plane in the case where the base material part 1 is GaN), and the back surface 3 that is −C plane (for example, the back surface 3 may be an N polar plane in the case where the base material part 1 is GaN). The +C plane as the front surface 2 can grow a Group III nitrate crystal with higher quality on the front surface 2.

Figure 2:
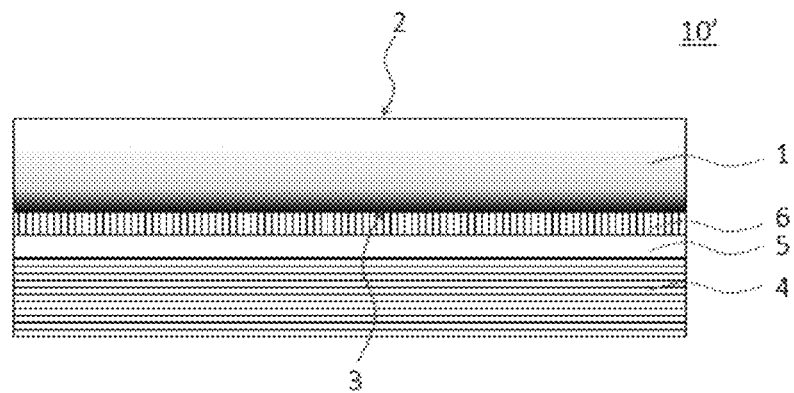
FIG. 2 is a schematic cross sectional view showing another example of a Group III nitride substrate according to one embodiment.

FIG. 2 is a schematic cross sectional view showing another example of a Group III nitride substrate according to another embodiment. As shown in FIG. 2, the base material part 1 formed from a Group III nitride may have, on the side of the back surface 3, a RAMgO$_4$ substrate 4 containing a single crystal represented by the general formula RAMgO$_4$ (wherein R represents one or a plurality of trivalent elements selected from the group consisting of Sc, In, Y, and a lanthanoid element, and A represents one or a plurality of trivalent elements selected from the group consisting of Fe(III), Ga, and Al). The RAMgO$_4$ has a lattice constant that is close to a Group III nitride, and thus reduces warpage and cracks of the Group III nitride substrate 10', as compared to the case where a sapphire substrate or the like is used as a base substrate. The use of the RAMgO$_4$ substrate 4 enhances the mechanical strength as compared to the case where the base material part 1 formed of a Group III nitride is used solely, and thus suppresses occurrence of defects, such as breakage and cracks, of the base material part 1 in the transportation and the growth of a Group III nitride crystal on the front surface 2.

A buffer layer 5 containing a polycrystalline or amorphous material may be contained between the base material part 1 and the RAMgO$_4$ substrate 4. The buffer layer 5 formed of a polycrystalline or amorphous material contained between the base material part 1 and the RAMgO$_4$ substrate 4 can suppresses occurrence of deterioration in crystal quality, such as crystal defects, of the base material part 1 caused by the difference in lattice constant between the back surface 3 of the base material part 1 and the RAMgO$_4$ substrate 4. A Group III nitride film 6 containing a single crystal may be further contained between the base material part 1 and the buffer layer 5. The Group III nitride film 6 containing a single crystal therebetween can suppress polycrystallization and deterioration in crystal quality of the base material part 1 caused by the buffer layer 5, which is formed of polycrystals. The Group III nitride substrate herein can be produced by the method for producing a Group III nitride crystal described later, and a Group III nitride crystal that is produced by the method described later may be the base material part 1 of the Group III nitride substrate 10 or 10' shown above.

Figure 3:
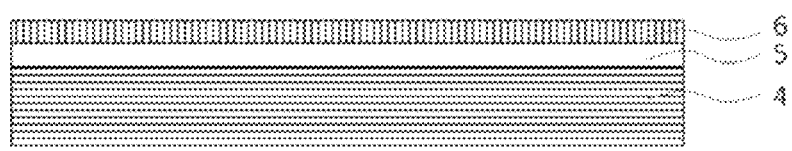
FIG. 3 is a schematic cross sectional view showing an example of an $RAMgO_4$-containing substrate used one embodiment.
Figure 4:
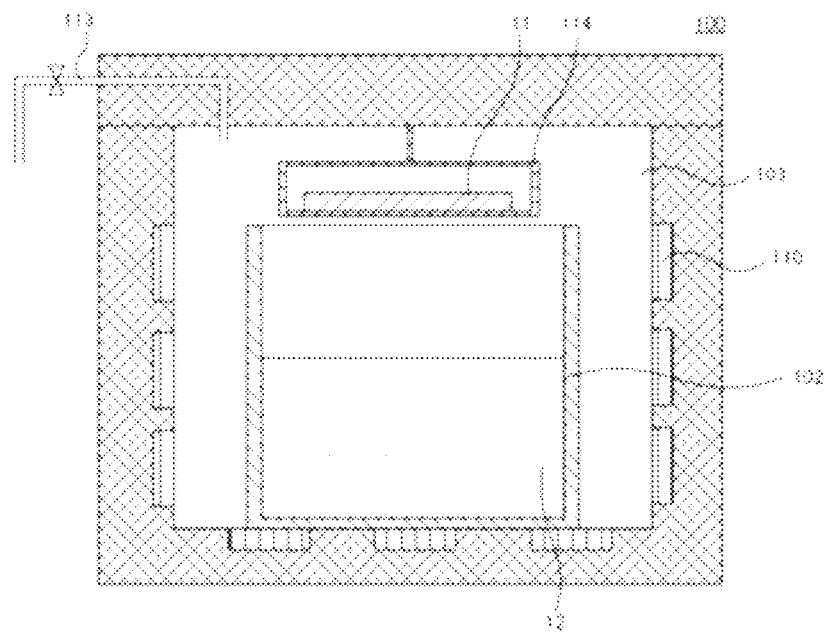
FIG. 4 is a schematic cross sectional view showing a crystal production equipment used in one embodiment.
Figure 5:
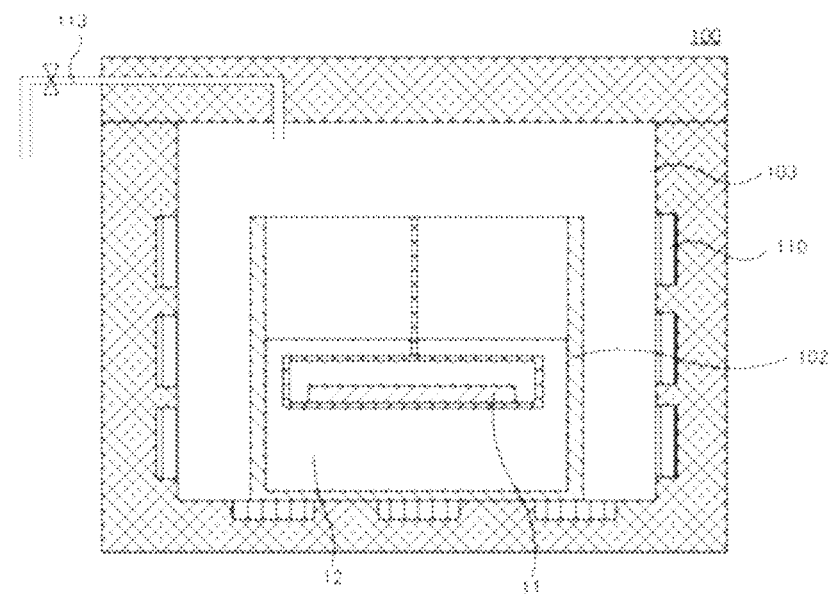
FIG. 5 is a schematic cross sectional view showing a crystal production equipment used in one embodiment.

The method for producing a Group III nitride crystal herein will be described below. FIGS. 4 and 5 are schematic cross sectional views showing a reaction equipment (crystal production equipment) 100 for performing a flux method, as one example of an equipment for performing the production of a Group III nitride crystal of one embodiment. As shown in FIG. 5, in the method for producing a Group III nitride crystal of the embodiment, an RAMgO$_4$-containing substrate 11 shown in FIG. 3 is immersed in a mixed liquid 12 containing a Group III element and a flux, and in this state, nitrogen gas is introduced to the reaction chamber 103. The Group III element and nitrogen are reacted in the mixed liquid 12, and thereby a crystal of a Group III nitride is grown on the surface of the RAMgO$_4$-containing substrate 11. In the crystal growth, Mg is diffused from the RAMgO$_4$-containing substrate 11 to the Group III nitride crystal, thereby providing the desired Group III nitride crystal containing Mg.

The production method of the embodiment performs a step of preparing an RAMgO$_4$ substrate and forming a buffer layer thereon, a step of forming a Group III nitride film on the buffer layer (i.e., an RAMgO$_4$-containing substrate forming step), and a step of forming a Group III nitride crystal on the Group III nitride film of the RAMgO$_4$-containing substrate by a flux method or a vapor phase epitaxial method, such as an HVPE method (i.e., a crystal forming step). The method for producing a Group III nitride crystal according to the embodiment will be described below with reference to the case as one example where the RAMgO$_4$ substrate is a substrate formed of a single crystal of ScAlMgO$_4$ (which may be hereinafter referred to as an "ScAlMgO$_4$ substrate"), and a GaN crystal is produced as the Group III nitride crystal.

RAMgO$_4$-Containing Substrate, Forming Step

As a substrate for producing a crystal, an ScAlMgO$_4$ substrate 4 is prepared. Subsequently, a buffer layer 5 is formed on the ScAlMgO$_4$ substrate 4 at a first temperature. Furthermore, a Group III nitride film 6 is formed on the buffer layer 5 at a second temperature that is higher than the first temperature, and thereby an ScAlMgO$_4$-containing substrate 11 shown in FIG. 3 is formed. The layers contained in the ScAlMgO$_4$-containing substrate 11 will be described below.

The ScAlMgO$_4$ substrate 4 is a substrate formed of a single crystal of ScAlMgO$_4$, and preferably has a thickness of approximately from 100 to 1,000 µm, and more preferably from 300 to 600 µm. The thickness of the ScAlMgO$_4$ substrate 4 in this range may facilitate the enhancement of the strength of the ScAlMgO$_4$-containing substrate 11, thereby preventing breakage or the like in the production of a GaN crystal. The shape of the ScAlMgO$_4$ substrate 4 is not particularly limited, and is preferably in the form of a wafer having a diameter of approximately from 50 to 150 mm taking the industrial practicality into consideration.

The surface of the ScAlMgO$_4$ substrate 4, on which the buffer layer 5 is to be formed, (which may be hereinafter referred to as an "epitaxial growth surface") preferably does not have irregularities having a height of 500 nm or more on the surface thereof. When the epitaxial growth surface has irregularities having a height of 500 nm or more, a problem may occur in the epitaxial growth of GaN on the ScAlMgO$_4$-containing substrate 11.

The surface of the ScAlMgO$_4$ substrate 4 that is opposite to the epitaxial growth surface (which may be hereinafter referred to as a "back surface") preferably has irregularities having a uniform height of 500 nm or more formed homogeneously thereon. When the irregularities having a uniform height of 500 nm or more are not formed on the back surface of the ScAlMgO$_4$ substrate 4, light that is used for an exposure treatment for forming a pattern of a GaN crystal or a semiconductor layer, a metal layer or the like formed thereon is reflected by the flat portion of the back surface and may cause an adverse affect to the exposure. The "substantially uniform irregularities formed homogeneously" mean that the substantially uniform irregularities are formed in such a manner that the area of the region having continuously a height of the irregularities of 500 nm or less is 1 mm$^2$ or less. When the irregularities are formed locally, the light is reflected by the portion having no irregularity in the exposure treatment and may cause an adverse affect to the exposure. The height of the irregularities herein is a value that is measured by a laser reflection length measuring device.

The ScAlMgO$_4$ substrate can be produced in the following manner. As starting materials, Sc$_2$O$_3$, Al$_2$O$_2$, and MgO each having a purity of 4N (99.99%) or more are mixed in the prescribed molar ratio. The starting material is placed in a crucible formed of iridium. The crucible having the starting material placed therein is then placed in a high-frequency induction heating type or resistance heating type Czochralski furnace (growing furnace), and the interior of the furnace is vacuumed. Thereafter, nitrogen or argon is introduced therein, and at the time when the interior of the furnace is at atmospheric pressure, the crucible is heated. The starting material is melted by gradually heating the material over approximately 10 hours to the melting point of ScAlMgO$_4$. An ScAlMgO$_4$ single crystal having been cut into the (0001) azimuth, is used as a seed crystal, and the seed crystal is descended to the vicinity of the molten liquid in the crucible. Thereafter, while rotating the seed crystal, the seed crystal is gradually descended to make the tip end of the seed crystal contact the molten liquid, and then the seed crystal is raised at a raising speed of 0.5 mm/h in the (0001) azimuthal direction while gradually decreasing the temperature to grow a crystal. According to the procedure, a single crystal ingot of ScAlMgO$_4$ is obtained.

The ScAlMgO$_4$ single crystal will be described. The ScAlMgO$_4$ single crystal has a structure containing an ScO$_2$ layer like the (111) plane of the rock salt structure and an AlMgO$_4$ layer like the (0001) plane of the hexagonal structure, which are laminated alternately. The two layers like the (0001) plane of the hexagonal structure are of a planar structure as compared to the wurtzite structure, and the bond between the upper and lower layers is longer than the bond in the plane by approximately 0.03 nm, and has a weak bond strength. Accordingly, the ScAlMgO$_4$ single crystal can be cleaved at the (0001) plane. By utilizing these characteristics, a bulk material thereof can be divided through cleavage to provide an ScAlMgO$_4$ substrate having a desired thickness. The lattice constant of the (0001) plane (a axis) of ScAlMgO$_4$ is approximately 0.325 nm, which is very close to the lattice constant of the a axis of GaN, 0.319 nm, and the lattice mismatch ratio therebetween is approximately 1.9%.

The ScAlMgO$_4$ single crystal can be easily cleaved, but when the cleaving force in the cleavage direction on cleavage is fluctuated, the cleavage does not occur in the same atomic layer, and it is difficult to provide a flat epitaxial growth surface in this case. Accordingly, in the production of the ScAlMgO$_4$ substrate, the cleaved surface on the side of the epitaxial growth surface is preferably processed by polishing to avoid irregularities having a height of 500 nm or more. Examples of the processing method include a method of forming irregularities having a height of 500 nm or more in the region to be the epitaxial growth surface on the ScAlMgO$_4$ substrate, and then polishing the irregularities having a height of 500 nm or more to remove the irregularities having a height of 500 nm or more.

More specifically, the surface to be the epitaxial growth surface of the ScAlMgO$_4$ substrate is ground under the following condition with a whetstone having diamond abrasive grains of #300 or more and #2000 or less attached thereto, and thereby irregularities having a height of 500 nm or more can be formed. The rotation number of the whetstone may be 500 min$^{-1}$ or more and 50,000 min−1 or less, the rotation number of the ScAlMgO$_4$ substrate may be 10 min$^{-1}$ or more and 300 min$^{-1}$ or less, the processing: speed may be 0.01 μm/sec or more and 1 μm/sec or less, and the processing elimination amount may be 1 μm or more and 300 μm or less. Subsequently, the substrate is polished under the following condition with a polishing pad formed of a slurry mainly containing colloidal silica and a nonwoven fabric, and thereby the irregularities having a height of 500 nm or more can be removed. The rotation number of the polishing pad may be 10 min$^{-1}$ or more and 1,000 min$^{-1}$ or less, the slurry supplying amount may be 0.02 mL/min or more and 2 mL/min or less, and the pressure applied may be 1,000 Pa or more and 20,000 Pa or less. Furthermore, the pressure applied may be decreased with the progress of the processing to 10,000 Pa or more and 20,000 Pa or less, 5,000 Pa or more and 10,000 Pa or less, and 1,000 Pa or more and 5,000 Pa or less, in this order, and thereby the epitaxial growth surface that does not have irregularities having a height of 500 nm or more, and particularly does not have irregularities having a height of 50 nm or more, can be formed precisely. In the aforementioned processing condition, the slurry supplying amount depends on the size of the ScAlMgO$_4$ substrate. The aforementioned slurry supplying amount is a value for polishing a substrate having a 10 mm square size, and for a diameter of 50 mm, for example, the slurry supplying amount may be 1 mL/min or more and 100 mL/min or less.

Examples of the method for homogeneously forming the irregularities having a uniform height of 500 nm or more on the back surface include a method of processing by grinding with a diamond fixed whetstone. The abrasive grains of the fixed whetstone are preferably diamond abrasive grains of #300 or more and #2000 or less, and more preferably diamond abrasive grains of #600. More specifically, the substrate may be processed by grinding with a whetstone having diamond abrasive grains of #300 or more and #2000 or less fixed thereto, under the condition of a rotation number of the whetstone of 500 min$^{-1}$ or more and 50,000 min$^{-1}$ or less, a rotation number of the ScAlMgO$_4$ substrate of 10 min$^{-1}$ or more and 300 min$^{-1}$ or less, a processing speed of 0.01 μm/sec or more and 1 μm/sec or less, and a processing elimination amount of 1 μm or more and 300 μm or less, and thereby the irregularities can be formed. At this time, by using a diamond whetstone of #600, the differences in height among the plural peaks in the irregularities can be further decreased. The processing condition in this case is preferably a rotation number of the whetstone of 1,800 min$^-$, a rotation number of the ScAlMgO$_4$ substrate of 100 min$^{-1}$, a processing speed of 0.3 μm/sec, and a processing elimination amount of 20 μm.

The buffer layer 5 is a layer that relaxes the difference in lattice constant between ScAlMgO$_4$ and the Group III nitride for forming the high quality III nitride film 6 on the ScAlMgO$_4$ substrate 4. The buffer layer 5 is preferably a material having a lattice constant that is close to the lattice constants of ScAlMgO$_4$ and the Group III nitride, and may be a layer formed of a Group III nitride, such as GaN. The buffer layer is preferably an amorphous or polycrystalline layer grown at a relatively low temperature of 400° C. or more and 700° C. or less. The use of the buffer layer of this type may prevent the formation of lattice defects and the like in the Group III nitride film 6 formed on the buffer layer.

The thickness of the buffer layer 5 is preferably 10 nm or more and 50 nm or less, and more preferably 20 nm or more and 40 nm or less. When the thickness of the buffer layer is 10 nm or more, the effect of relaxing the difference in lattice constant may be exhibited to prevent the formation of lattice defects and the like in the resulting crystal of GaN. When the thickness of the buffer layer is too large, on the other hand, the information of the crystal lattice may be lost, thereby causing failure to perform favorable epitaxial growth.

The buffer layer 5 can be formed by a vapor phase epitaxial method, and may be, for example, a layer formed by an MOCVD method.

The Group III nitride film 6 is a layer that functions as a seed for GaN crystal growth in the production of a crystal of GaN. When the ScAlMgO$_4$-containing substrate 11 has the Group III nitride film 6, the crystal of GaN can be grown uniformly to facilitate the formation of high quality GaN. The Group III nitride film 6 may be a layer formed of GaN.

The thickness of the Group III nitride film 6 is preferably from 0.5 to 20 μm, and more preferably 1 μm or more and 5 μm or less. When the thickness of the Group III nitride film 6 is 0.5 μm or more, the Group III nitride film 6 formed on the amorphous or polycrystalline buffer layer 5 may be a favorable single crystal, so as to prevent the formation of lattice defects and the like in the resulting crystal of GaN. The Group III nitride film 6 can be formed by a vapor phase epitaxial method, and can be formed, for example, by an MOCVD method. The temperature in the formation of the Group III nitride film 6 may be higher than the temperature in the formation of the buffer layer 5, and is preferably 1,000° C. or more and 1,300° C. or less, and more preferably 1,100° C. or more and 1,200° C. or less. The Group III nitride film 6 with good crystal quality can be formed by the formation at the temperature.

The surface of the $ScAlMgO_4$-containing substrate 11, on which a GaN crystal is to foe grown, i.e., the surface of the Group III nitride film 6 in this embodiment, may be subjected a cleaning treatment before producing the GaN crystal. The cleaning treatment can remove impurities and the like on the surface, and thereby a GaN crystal with higher quality can be obtained. Examples of the gas for cleaning include hydrogen ($H_2$) gas, nitrogen ($N_2$) gas, ammonia ($NH_3$), gas, a rare gas (such as He, Ne, Ar, Kr, Xe, and Rn), and mixed gases thereof. The cleaning treatment may be performed by making contact with the gas at a temperature of 900° C. or more and 1,100° C. or less for 1 minute or more, and preferably 2 minutes or more and 10 minutes or less.

GaN Crystal Forming Step

Subsequently, a GaN crystal is formed on the Group III nitride film 6 of the $RAMgO_4$-containing substrate by a flux method. The GaN crystal can be formed, for example, by using the equipment shown in FIGS. 4 and 5 in the following manner.

As shown in FIG. 4, the reaction equipment 100 has a reaction chamber 103 formed with a stainless steel, a thermal insulating material, and the like, and a crucible 102 is disposed in the reaction, chamber 103. The crucible may be formed of boron nitride (BN), alumina ($Al_2O_3$), or the like. A heater 110 is disposed around the reaction chamber 103, and the heater 110 is designed to be able to control the temperature inside the reaction chamber 103, particularly inside the crucible 102.

The reaction equipment 100 also has thereinside a substrate retention mechanism 114 for retaining liftably an $ScAlMgO_4$-containing substrate 11. A nitrogen gas supplying line 113 for supplying nitrogen gas is connected to the reaction chamber 103, and the nitrogen gas supplying line 113 is connected to a raw material gas tank (which is not shown in the figure) or the like.

In the production of the GaN crystal, Na as a flux and Ga as a Group III element are placed in the crucible 102 in the reaction chamber 103 of the reaction equipment 100. At this time, a trace additive may be added thereto depending on necessity. If the operation is performed in the air, there is a possibility that Na is oxidized. Therefore, the operation is preferably performed in a state, in which an inert gas, such as Ar and nitrogen gas, is filled. Subsequently, the reaction chamber 103 is sealed, the temperature of the crucible is controlled to a temperature that is higher than the temperature in the formation of the buffer layer, which may be specifically 800° C. or more and 1,000° C. or less, and more preferably 850° C. or more and 950° C. or less, and further nitrogen gas is charged in the reaction chamber 103. At this time, the gas pressure in the reaction chamber may be $1\times10^6$ Pa or more and $1\times10^7$ Pa or less, and more preferably $3\times10^6$ Pa or more and $5\times10^6$ Pa or less. The increase of the gas pressure in the reaction chamber 103 may facilitate the sufficient dissolution of nitrogen in Na having been melted at a high temperature, and the temperature and the pressure thus controlled as above may grow the GaN crystal at a high rate. Thereafter, the operation of retention, mixing by agitation, or the like is performed until Na, Ga, and the trace additive are uniformly mixed. The operation of retention or mixing by agitation is preferably performed for a period of time of from 1 to 50 hours, and more preferably from 10 to 25 hours. The operation of retention or mixing by agitation performed for the period of time may mix Na, Ga, and the trace additive uniformly. At this time, if the $ScAlMgO_4$-containing substrate 11 is in contact with the mixed liquid 12 of Na and Ga that has a temperature lower than the prescribed temperature or is not mixed uniformly, etching of the Group III nitride film 6, deposition of the GaN crystal with poor quality, and the like may occur. Accordingly, the $ScAlMgO_4$-containing substrate 11 is preferably retained at the upper part of the reaction chamber 103 with the substrate retention mechanism 114.

Thereafter, as shown in FIG. 5, the $ScAlMgO_4$-containing substrate 11 is immersed in the mixed liquid 12. The mixed liquid 12 may be agitated. The agitation of the mixed liquid 12 may be performed by a physical movement of the crucible 102, such as vibration and rotation, and the mixed liquid 12 may be agitated with an agitation bar or an agitation blade. The mixed liquid 12 may also be agitated through thermal convection by forming a heat gradient in the mixed liquid 12. The agitation may retain the concentrations of Ga and N uniformly in the mixed liquid 12, thereby growing the crystal stably. Then, a GaN crystal is epitaxially grown on the Group III nitride film 6 of the $ScAlMgO_4$-containing substrate 11. The crystal is grown in this state for a certain period of time, and thereby a GaN crystal having a thickness of approximately from 100 μm to 5 mm can be obtained.

Since the temperature in the growth of the GaN crystal is such a high temperature as 800° C. or more, magnesium (Mg) as an element constituting the $ScAlMgO_4$ substrate 4 is diffused into the growing GaN crystal through the buffer layer 5 and the Group III nitride film 6. For example, in the case where a GaN crystal having a thickness of 1 mm is formed at a growth temperature of 880° C., the Mg concentrations in the GaN crystal thus measured are as shown in Table 1 below.

TABLE 1

| Measured position in GaN crystal (thickness direction) | Mg concentration (atoms/cm³) |
| --- | --- |
| Vicinity of front surface of GaN crystal (with large distance from $ScAlMgO_4$-containing substrate) | $1 \times 10^{17}$ to $2 \times 10^{17}$ |
| Vicinity of middle portion of GaN crystal (with middle distance from $ScAlMgO_4$-containing substrate) | $4 \times 10^{17}$ to $5 \times 10^{17}$ |
| Vicinity of back surface of GaN crystal (with small distance from $ScAlMgO_4$-containing substrate) | $8 \times 10^{17}$ to $1 \times 10^{18}$ |

As shown in Table 1, according to the production method of the embodiment, a GaN crystal having Mg concentrations can be obtained, which are different from each other between the front surface side and the back surface side (i.e., the side of the $ScAlMgO_4$ substrate). As having been described, the addition of Mg increases the lattice constant of a GaN crystal. As shown in Table 1, the Mg concentration is higher in the vicinity of the boundary to the $ScAlMgO_4$-containing substrate (i.e., the back surface side), and it is considered that the lattice constant of the GaN crystal therein is increased. According to the structure, the lattice mismatch ratio to ScAlMgO$_4$ is decreased to provide a GaN crystal with high quality. On the other hand, the Mg concentration is lower in the vicinity of the front surface of the GaN crystal, and it is considered that the increase of the lattice constant of the GaN crystal due to the addition of Mg is suppressed, and the lattice constant is close to the lattice constant inherent to the GaN crystal. According to the structure, in the formation of a Group III nitride layer, such as GaN, necessary for producing an electronic device, such as a light emitting diode, on the GaN crystal, the lattice mismatch ratio between the GaN crystal and the Group III nitride layer is decreased, and a single crystal layer (i.e., a Group III nitride layer) with high quality can be obtained.

The Group III nitride crystal (i.e., the aforementioned base material part) obtained by the production method of the embodiment preferably has an Mg concentration that is gradually changed in the thickness direction of the Group III nitride crystal. This is because the lattice matching between the Group III nitride crystal and the Group III nitride crystal layer or the device formed of the same material (for example, GaN) thereon can be retained while compensating the lattice mismatch to the seed substrate (RAMgO$_4$-containing substrate) formed of ScAlMgO$_4$ as a dissimilar material. At this time, the Mg concentration in the Group III nitride crystal (base material part) is preferably changed gradually in such a manner that the Mg concentration on the front surface side of the Group III nitride crystal (i.e., the opposite side to the RAMgO$_4$-containing substrates is lower than the Mg concentration of the back surface side (i.e., the side of the RAMgO$_4$-containing substrate). With the Mg concentration that is changed in this manner, the lattice constant in the Group III nitride crystal (base material part) is changed to be close to the lattice constant of the Group III nitride layer toward the front surface side of the Group III nitride crystal. This is because the lattice matching to the Group III nitride layer is facilitated to achieve the high quality Group III nitride substrate. As shown in Table 1, the production method of the embodiment provides the base material part 1 (GaN crystal) having an Mg concentration that is gradually changed in such a manner that the Mg concentration of the surface 2 is lower than the Mg concentration of the back surface 3.

Specifically, the Mg concentration in the Group III nitride crystal (base material part 1) is preferably $5 \times 10^{17}$ (atoms/cm$^3$) or less, and more preferably from $1 \times 10^{17}$ to $2 \times 10^{17}$ (atoms/cm$^3$), on the surface (front surface 2) opposite to the RAMgO$_4$-containing substrate, and preferably exceeds $5 \times 10^{18}$ (atoms/cur), and more preferably from $8 \times 10^{17}$ to $1 \times 10^{18}$ (atoms/cm$^3$), on the surface (back surface 3) on the side of the RAMgO$_4$-containing substrate. The Mg concentration of the Group III nitride crystal (base material part 1) at the center in the thickness direction thereof is preferably from $4 \times 10^{17}$ to $5 \times 10^{17}$ (atoms/cm$^3$). The Mg concentration of the Group III nitride crystal herein is a value measured by a secondary ion mass spectroscopy (SIMS). The Mg concentration in the thickness direction of the Group III nitride crystal can be obtained in such a manner that the Group III nitride crystal is cut in the direction perpendicular to the front surface 2 and the back surface 3 thereof to form a cross section in the thickness direction, and the center portion in the thickness direction on the cross section is measured by a secondary ion mass spectroscopy. The Mg concentration on the front surface and the back surface of the Group III nitride crystal can be controlled within the aforementioned ranges by controlling the thickness of the buffer layer 5 or the Group III nitride film 6 and the temperature and the time in the growth of the Group III nitride crystal. Specifically, the Mg concentration can be increased by decreasing the thickness of the buffer layer 5 or the Group III nitride film 6, and thereby the difference in concentration between the front and back surfaces can be enhanced. The Mg concentration can be decreased by increasing the thickness of the buffer layer 5 or the Group III nitride film 6, and thereby the difference in concentration between the front and back surfaces can be reduced. The Mg concentration can be increased by increasing the temperature in the growth of the Group III nitride crystal or prolonging the growth time therein, whereas the Mg concentration can be decreased by decreasing the temperature in the growth of the Group III nitride crystal or shortening the growth time therein.

The electroconductivity and the band gap of the resulting GaN crystal can be controlled by adding a trace additive along with Na and Ga in the formation of the GaN crystal in the embodiment. The additive also can accelerate the growth of the GaN crystal and can suppress the crystal deposition on the crucible. Examples of the trace additive include compounds containing boron (B), thallium (Tl), calcium (Ca), silicon (Si), sulfur (S), selenium (Se), tellurium (Te), carbon (C), oxygen (O), aluminum (Al), indium (In), alumina (Al$_2$O$_3$), indium nitride (InN), silicon nitride (Si$_3$N$_4$), silicon oxide (SiO$_2$), indium oxide (In$_2$O$_3$), zinc (Zn), magnesium (Mg), zinc oxide (ZnO), magnesium oxide (MgO), and germanium (Ge). The trace additive may be added solely, or two or more kinds thereof may be added.

While the embodiment using Na as the flux has been described, the embodiment is not limited thereto, and an alkali metal other than Na may be used. Specific examples thereof include at least one Selected from the group consisting of Na, Li, K, Rb, Cs, and Fr, and for example, a mixed flux of Na and Li may be used.

Other Embodiments

While the embodiment using the Na flux method for the growth of the Group III nitride crystal (GaN crystal) has been described, the embodiment is not limited thereto, and a vapor phase epitaxial method, such as an HVPE method and an OVPE method, may be used. In the case using a vapor phase epitaxial method, a gas containing a nitrogen element, such as NH$_3$, and a gas containing a Group III compound, such as GaCl and Ga$_2$O, are used as raw material gases, and a Group III nitride crystal can be grown at a temperature of 1,000° C. or more and 1,400° C. or less, which is higher than the temperature for the formation of the buffer layer 5. In the case using the vapor phase epitaxial method, the crystal growth is performed at a high temperature as similar to the case using the flux method, and therefore Mg is added to the GaN crystal from the RAMgO$_4$-containing substrate through diffusion of Mg. At this time, in the resulting GaN crystal, the Mg concentration is higher on the side close to the RAMgO$_4$-containing substrate, i.e., the side of the back surface, whereas the Mg concentration is lower than the back surface on the side far from the RAMgO$_4$-containing substrate, i.e., the side of the front surface.

While the embodiment where the RAMgO$_4$-containing substrate contains the ScAlMgO$_4$-containing substrate has been described, the embodiment is not limited thereto. It suffices that the substrate contained in the RAMgO$_4$-containing substrate is a substrate that is constituted by a substantially sole crystal material represented by the general formula RAMgO$_4$. In the general formula, R represents one or a plurality of trivalent elements selected from Sc, In, Y, and a lanthanoid element (atomic number: 67 to 71), and A represents one or a plurality of trivalent elements selected from Fe(III), Ga, and Al. The substantially sole crystal material means a crystalline solid, in which the material contains 90% by atom or more of the structure represented by $RAMgO_4$, and in terms of an arbitrary crystal axis, the direction of the crystal axis is not changed in any part on the epitaxial growth surface. However, a material having a crystal axis that is locally changed in direction thereof and a material containing local lattice defects are handled as a single crystal. Mg represents magnesium, and O represents oxygen. As described above, it is particularly preferred that R is Sc, and A is Al.

While the embodiment where the crystal of GaN as the Group III nitride is produced, the embodiment is not limited thereto. The Group III nitride in the embodiment may be a two-component, three-component, or four-component compound containing a Group III element (such as Al, Ga, or In) and nitrogen, and examples thereof include compounds represented by the general formula $Al_{1-x-y}Ga_yIn_xN$ (wherein x and y satisfy $0 \leq x \leq 1$, $0 \leq y \leq 1$, and $0 \leq 1-x-y \leq 1$). The group III nitride may contain a p-type or n-type impurity. For the buffer layer 5 and the Group III nitride film 6 described above, the material thereof is GaN, but may also be the aforementioned compounds.

For example, a compound obtained by replacing at least a part of the Group III element (such as Al, Ga, or In) by boron (B), thallium (Tl), or the like may be used, and a compound obtained by replacing at least a part of nitrogen (N) by phosphorus (P), arsenic (As), antimony (Sb), bismuth (Bi), or the like may be used. Examples of the p-type impurity (acceptor) added to the Group III nitride include known p-type impurities, such as magnesium (Mg) and calcium (Ga). Examples of the n-type impurity (donor) added thereto include known n-type impurities, such as silicon (Si), sulfur (S), selenium (Se), tellurium (Te), oxygen (O), and germanium (Ge). The impurities (acceptor or donor) may be added as a combination of two or more elements. The crystals of the Group III nitride of this type can be produced in the similar manner as above. The embodiments described above can be appropriately combined with each other, and the resulting combination may exhibit the advantageous effects of the embodiments.

According to the production method of the embodiment, a Group III nitride crystal with high quality can be obtained, and thereby for example, an LED device reduced in light emission unevenness and luminance reduction, and the like can be obtained.

According to the aforementioned and other aspects, the mismatch in lattice constant between a Group III nitride substrate and an underlying substrate for producing the Group III nitride substrate or a Group III nitride layer, such as a light emitting layer, formed on the Group III nitride substrate can be reduced. Accordingly, a Group III nitride substrate with high quality and a high performance electronic device, such as a light emitting diode, using the substrate can be produced.

What is claimed is:

1. A Group III nitride substrate comprising:
   a base material part having a front surface and a back surface,
   wherein the front surface of the base material part and the back surface of the base material part have different Mg concentrations,
   wherein the Mg concentration of the front surface of the base material part is $5 \times 10^{17}$ (atoms/cm$^3$) or less, and the Mg concentration of the back surface of the base material part exceeds $5 \times 10^{17}$ (atoms/cm$^3$), and
   wherein the base material part is formed of a Group III nitride having a thickness from 100 µm to 5 mm.

2. The Group III nitride substrate according to claim 1, wherein the front surface of the base material part is a surface, on which a Group III nitrate crystal is grown, and the Mg concentration of the front surface is lower than the Mg concentration of the back surface.

3. The Group III nitride substrate according to claim 2, wherein the front surface of the base material part is a +C plane, and the back surface is −C plane.

4. The Group III nitride substrate according to claim 1, wherein the Mg concentration of the front surface of the base material part is in a range from $1 \times 10^{17}$ to $2 \times 10^{17}$ (atoms/cm$^3$), inclusive, and
   the Mg concentration of the back surface of the base material part is in a range from $8 \times 10^{17}$ to $1 \times 10^{18}$ (atoms/cm$^3$), inclusive.

5. The Group III nitride substrate according to claim 1, wherein an Mg concentration of a center in a thickness direction of the base material part is from $4 \times 10^{17}$ to $5 \times 10^{17}$ (atoms/cm$^3$).

6. The Group III nitride substrate according to claim 1, wherein an Mg concentration in the base material part is gradually changed in a thickness direction of the base material part.

7. The Group III nitride substrate according to claim 1, further comprising an $RAMgO_4$ substrate attached to the back surface of the base material part, wherein the $RAMgO_4$ substrate contains a single crystal represented by a general formula $RAMgO_4$ (wherein R represents one or a plurality of a trivalent element selected from a group consisting of Sc, In, Y, and a lanthanoid element, and A represents one or a plurality of a trivalent element selected from a group consisting of Fe(III), Ga, and Al).

8. The Group III nitride substrate according to claim 7, further comprising a buffer layer disposed between the base material part and the $RAMgO_4$ substrate, wherein the buffer layer contains a polycrystalline or amorphous material.

9. The Group III nitride substrate according to claim 8, further comprising a Group III nitride film disposed between the base material part and the buffer layer, wherein the Group III nitride film contains a single crystal.

10. The Group III nitride substate according to claim 1, wherein the base material part is formed of a GaN crystal.

* * * * *